US010380400B2

(12) United States Patent
Mainguet et al.

(10) Patent No.: US 10,380,400 B2
(45) Date of Patent: Aug. 13, 2019

(54) FINGERPRINT OR PALMPRINT SENSOR

(71) Applicants: Commissariat à l'Energie Atomique et aux Energies Alternatives, Paris (FR); SAFRAN IDENTITY & SECURITY, Issy-les-Moulineaux (FR)

(72) Inventors: Jean-François Mainguet, Grenoble (FR); Joel Yann Fourre, Marly-le-roi (FR); Josep Segura Puchades, Fontaine (FR)

(73) Assignees: COMMISSARIAT À L'ENERGIE ATOMIQUE ET AUX ENERGIES ALTERNATIVES, Paris (FR); IDEMIA IDENTITY & SECURITY FRANCE, Issy-les-Moulineaux (FR)

(*) Notice: Subject to any disclaimer, the term of this patent is extended or adjusted under 35 U.S.C. 154(b) by 24 days.

(21) Appl. No.: 15/569,068

(22) PCT Filed: Apr. 27, 2016

(86) PCT No.: PCT/FR2016/050992
§ 371 (c)(1),
(2) Date: Oct. 24, 2017

(87) PCT Pub. No.: WO2016/174353
PCT Pub. Date: Nov. 3, 2016

(65) Prior Publication Data
US 2018/0137325 A1  May 17, 2018

(30) Foreign Application Priority Data

Apr. 30, 2015 (FR) .................................... 15 53921

(51) Int. Cl.
*G06K 9/00* (2006.01)
*H01L 27/146* (2006.01)
(Continued)

(52) U.S. Cl.
CPC ......... *G06K 9/0002* (2013.01); *G06K 9/0004* (2013.01); *G06K 9/0008* (2013.01);
(Continued)

(58) Field of Classification Search
CPC .................................................... G06K 9/0004
See application file for complete search history.

(56) References Cited

U.S. PATENT DOCUMENTS 5,193,911 A    3/1993  Nix et al.
2003/0090650 A1  5/2003  Fujieda
(Continued)

FOREIGN PATENT DOCUMENTS

EP       2385486 A1      11/2011
WO    2015/008902 A1     1/2015

OTHER PUBLICATIONS

PCT International Search Report; International Application No. PCT/FR2016/050993; dated Jun. 23, 2016, 2 pages.
(Continued)

*Primary Examiner* — Oneal R Mistry
(74) *Attorney, Agent, or Firm* — Moreno IP Law LLC

(57) ABSTRACT

The invention relates to a skin print sensor (140) comprising, on a supporting substrate, a plurality of elementary acquisition cells (141), each of which includes: a reading node (SN); a first photoelectric or pyroelectric conversion element (PYR) having a first electrode that is connected to the reading node (SN) as well as a second electrode that is connected to a control node (CMD) of the cell; and a third electrode (EL) that is connected to the reading node (SN), is coated with a dielectric layer and is designed to form a capacitance along with the skin of a user; in each cell of said sensor, the control node (CMD) is designed to receive a control signal that initiates reading of a value on the reading node (SN), said value representing the capacitance formed between the third electrode (EL) and the user's skin.

10 Claims, 2 Drawing Sheets

(51) Int. Cl.
*H01L 27/16* (2006.01)
*H01L 31/16* (2006.01)
*H01L 37/02* (2006.01)

(52) U.S. Cl.
CPC ........ *H01L 27/14612* (2013.01); *H01L 27/16* (2013.01); *H01L 31/16* (2013.01); *H01L 37/02* (2013.01)

(56) References Cited

U.S. PATENT DOCUMENTS

| | | |
|---|---|---|
| 2009/0067684 A1 | 3/2009 | Mainguet |
| 2010/0084542 A1 | 4/2010 | Chou |
| 2011/0006192 A1* | 1/2011 | Miyazawa ........ H01L 27/14609 250/208.1 |
| 2011/0280276 A1 | 11/2011 | Mainguet et al. |
| 2014/0028924 A1* | 1/2014 | Yamaguchi ............... G02F 1/29 349/1 |
| 2014/0354597 A1 | 12/2014 | Kitchens, II et al. |
| 2016/0014363 A1* | 1/2016 | Kito ....................... H04N 5/378 348/308 |
| 2016/0123775 A1* | 5/2016 | Chen ........................ G01D 5/24 324/663 |
| 2018/0137325 A1 | 5/2018 | Mainguet et al. |

OTHER PUBLICATIONS

PCT International Search Report; International Application No. PCT/FR2016/050992 dated Jun. 23, 2016, 2 pages.

\* cited by examiner

FINGERPRINT OR PALMPRINT SENSOR

The present patent application claims the priority benefit of French patent application FR15/53921 which is herein incorporated by reference.

BACKGROUND

The present application relates to fingerprint or palmprint sensors, and more generally to sensors of prints of skin portions.

DISCUSSION OF THE RELATED ART

Various types of sensors have been provided to perform an electronic acquisition of a fingerprint and/or of a palmprint, that is, to provide an image of the pattern formed by the ridges and valleys (or depressions) of the skin of a finger, of a plurality of fingers, and/or of the palm of the hand. Optical sensors, capacitive sensors, thermal sensors, ultrasound sensors, and electric field sensors have in particular been provided.

Capacitive, thermal, and/or optical print sensors formed in TFT ("Thin Film Transistor") technology, that is, comprising, on a dielectric support substrate, one or a plurality of elementary acquisition cells, each elementary cell (or pixel) comprising a photoelectric, pyroelectric, and/or capacitive acquisition element, and one or a plurality of TFTs enabling to control this element, are here particularly considered. TFT here designates transistors formed by successive depositions of conductive, insulating, and semiconductor layers on the support substrate. In particular, in a TFT, the semiconductor channel-forming region of the transistor is formed by deposition of a layer of a semiconductor material, for example, hydrogenated amorphous silicon, polysilicon (silicon which is made polycrystalline after an anneal, for example), or also a material of IGZO ("Indium Gallium Zinc Oxide") type, where such a deposition may be preceded or followed by the deposition of a conductive layer used to form a gate, source, or drain electrode of the transistor. Print sensors made in TFT technology have the advantage of having a relatively low cost, particularly due to the use of a support substrate made of a low-cost material such as glass (instead of a single-crystal silicon substrate generally used to form transistors) and of being easily integrable in many types of electronic devices, and in particular in devices already using the TFT technology to carry out other functions, for example, to form display screens. The TFT technology is particularly advantageous in the field of print sensors where the sensor surface is substantially identical to the surface of the print to be acquired, that is, where no optical focusing system (or lens) is placed between the sensor and the object having its image desired to be acquired. Indeed, such sensors generally have relatively large surface areas, particularly when the print to be acquired involves a plurality of fingers and/or on the palm of the hand, and thus take advantage of the low cost of TFT technology. Embodiments will be described hereafter in relation with illustrative examples of implementation in TFT technology. The described embodiments are however not limited to TFT technology.

It would be desirable to be able to improve at least certain aspects of existing thermal, optical, and/or capacitive print sensors.

SUMMARY

To achieve this, an embodiment provides a print sensor comprising, on a support substrate, a plurality of elementary acquisition cells, each cell comprising: a sense node; a first photoelectric or pyroelectric conversion element having a first electrode connected to the sense node and a second electrode connected to a control node of the cell; and a third electrode connected to the sense node, the third electrode being coated with a dielectric layer and being intended to form a capacitor with a user's skin, wherein, in each cell, the control node is capable of receiving a control signal enabling to implement the reading out, from the sense node, of a value representative of the capacitance formed between the third electrode and the user's skin.

According to an embodiment, in each cell, the first element is a photoelectric conversion element.

According to an embodiment, in each cell, the first element is a photodiode having its anode connected to the control node and having its cathode connected to the sense node.

According to an embodiment, each cell further comprises a pyroelectric conversion element connected between the control node and the sense node, in parallel with the first element.

According to an embodiment, in each cell, the first element is a pyroelectric conversion element.

According to an embodiment, each cell further comprises a photoelectric conversion element coupled to the sense node via a selection transistor.

According to an embodiment, the control signal is a square voltage wave.

According to an embodiment, the sensor further comprises a light source and/or a heat source.

According to an embodiment, in each cell, the sense node is coupled to a node of application of a reset potential via a reset transistor.

According to an embodiment, in each cell, the sense node is coupled to an output track of the cell via a transistor assembled as a follower source and a readout transistor.

BRIEF DESCRIPTION OF THE DRAWINGS

The foregoing and other features and advantages will be discussed in detail in the following non-limiting description of specific embodiments in connection with the accompanying drawings, among which.

DETAILED DESCRIPTION OF THE PRESENT EMBODIMENTS

Figure 1:
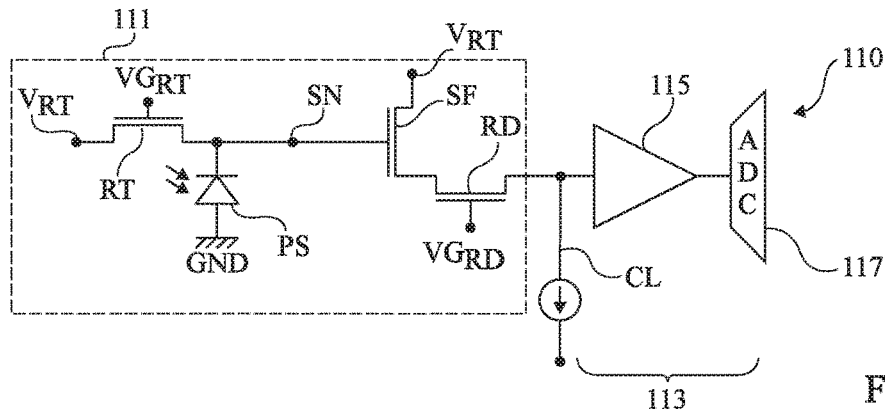
FIG. 1 is an electric diagram illustrating an example of an optical TFT print sensor.

For clarity, the same elements have been designated with the same reference numerals in the different drawings. Further, only those elements which are useful to the understanding of the described embodiments have been detailed.

In particular, the peripheral control circuits of the elementary cells of the described TFT print sensors have not been detailed, the forming of such circuits being within the abilities of those skilled in the art on reading of the present description. It should further be noted that in the present description, when architectures of elementary cells, of elementary cell arrays, or of print sensors are described, term "connected" is used to designate a direct electric connection, with no intermediate electronic component, for example, by means of a conductive track, and term "coupled" is used to designate an electronic connection which may be direct or via intermediate components, for example, via a transistor. Further, in the following description, when reference is made to terms qualifying absolute positions, such as terms "front", "rear", "top", "bottom", "left", "right", etc., or relative positions, such as terms "above", "under", "upper", "lower", etc., or to terms qualifying directions, such as terms "horizontal", "vertical", etc., it is referred to the orientation of the drawings.

FIG. 1 is an electric diagram illustrating an example of an optical TFT print sensor 110. Sensor 110 comprises a plurality of identical or similar elementary acquisition cells 111, made in TFT technology on a surface of a transparent support substrate, for example, made of glass, which will be called hereafter, by convention, upper surface of the substrate. For simplification, a single cell 111 has been shown in FIG. 1. Each cell 111 comprises a photoelectric conversion element PS, for example, a photodiode having its anode coupled to a node of application of a reference potential GND (for example, the ground), and having its cathode connected to a capacitive sense node SN of the cell. As an example, photodetector PS is a photodiode, for example, of PIN, PN, or organic type, or any other photosensitive element such as a phototransistor or an element containing SRO ("Silicon Rich Oxide"). In practice, the capacitance of node SN comprises the stray capacitance of photodetector PS, to which are added the stray capacitances of one or a plurality of transistors of the cell connected to node SN. In this example (usually called three-transistor active pixel), each cell 111 comprises a reset transistor RT coupling its sense node SN to a node of application of a reset potential $V_{RT}$, for example, a potential which is positive with respect to the potential of node GND. Each cell 111 further comprises a transistor SF assembled as a follower source, having its gate connected to node SN, and a readout transistor RD coupling the source of transistor SF to an output track CL of the cell. The drain of transistor SF is coupled to a node of application of a reference potential, for example, potential $V_{RT}$ or another potential. The control gate of transistor RT is connected to a node $VG_{RT}$ of application of a control potential of this transistor and the gate of transistor RD is connected to a node $VG_{RD}$ of application of a control potential of this transistor.

Output track CL of cell 111 is connected to an output stage 113 of the sensor. In this example, output stage 113 comprises an amplifier 115 having an input coupled to track CL and having its output coupled to an analog-to-digital converter 117 (ADC). Amplifier 115 is optional, and may in particular be omitted if the potential level of track CL is compatible with the input of analog-to-digital converter 117.

Sensor 110 further comprises an illumination light source, not shown. As an example, the illumination source is arranged on the side of the substrate surface opposite to cells 111, which will be called hereafter by convention lower surface of the substrate.

Sensor 110 operates as follows. The user places one finger (or a plurality of fingers and/or the palm) on or above the upper surface of the sensor (on the side of cells 111). The backlighting light source, arranged on the substrate side opposite to the cells, illuminates the finger through transparent areas of the assembly formed by the support substrate and cells 111. The light is then backscattered by the finger towards photodetectors PS with, at the level of each cell 111, a variable attenuation according to whether the finger portion located above the cell corresponds to a ridge or to a valley (or a depression) of the finger skin. As a variation, the light source may be placed above or next to the finger, the light being then transmitted by the finger towards photodetectors PS of the sensor, with a variable attenuation according to whether the finger portion located above the cell corresponds to a ridge or to a valley of the finger skin. In this last embodiment, a red or infrared illumination is for example selected, so that the quantity of light transmitted through the finger is significant.

During a phase of acquisition of an image point of a print by a cell 111, photodetector PS of the cell is first reset via transistor RT of the cell. Transistor RT is then made non-conductive and, during an integration period, photogenerated charges (generally negative) accumulate on sense node SN of the cell. At the end of the integration, the potential of sense node SN is transferred onto output track CL of the cell via transistors SF and RD. To achieve this, transistor RD of the cell is made conductive. The potential of output track CL is then read by the output stage 113 associated with output track CL. As an example, the potential of the sense node may also be read after the resetting and before the beginning of the integration, the output value of the pixel then being the difference between the reference value read before the integration and the value read after the integration.

As an example, a plurality of elementary cells 111 may be connected to a same output track CL and share a same output stage 113 of the sensor. Cells 111 are for example arranged in an array of rows and columns, the cells of a same column being connected to a same output track CL and to a same output stage 113, and the cells of different columns being connected to different output tracks CL and to different output stages 113. As an example, cells 111 are simultaneously controllable row by row, that is, the cells 111 of a same row have their nodes $VG_{RT}$, respectively $VG_{RD}$, connected to a same control track and the cells 111 of different rows have their nodes $VG_{RT}$, respectively $VG_{RD}$, connected to different control tracks.

Figure 2:
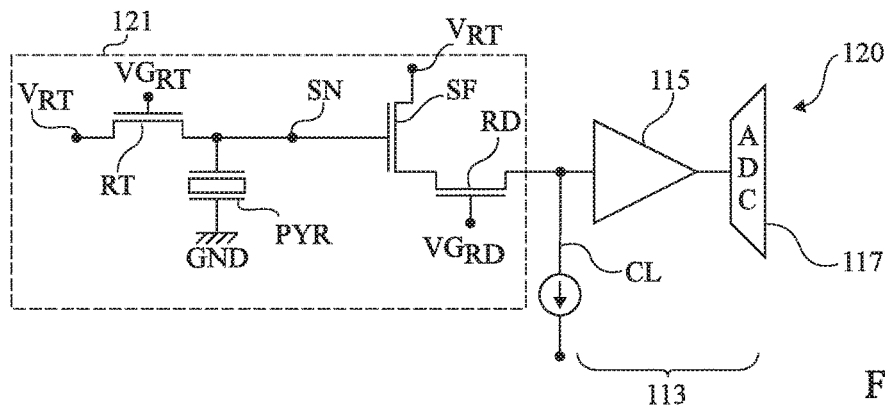
FIG. 2 is an electric diagram illustrating an example of a thermal TFT print sensor.

FIG. 2 is an electric diagram illustrating an example of a thermal TFT print sensor 120. Sensor 120 of FIG. 2 comprises elements common with sensor 110 of FIG. 1. These elements will not be described again. Sensor 120 differs from sensor 110 mainly in that, in sensor 120, elementary thermal-type acquisition cells 121 replace the elementary optical acquisition cells 111 of sensor 110. Elementary cells 121 of the sensor of FIG. 2 differ from elementary cells 111 of the sensor of FIG. 1 in that, in each cell 121, a pyroelectric conversion element PYR, coupling sense node SN of the cell to node GND, replaces photodetector PS of cells 111. Pyroelectric conversion element PYR typically comprises a layer of a pyroelectric material such as aluminum nitride (AlN), zinc oxide (ZnO), a polymer such as polyvinylidene fluoride (PVDF), having a pyroelectric coefficient in the order of 40 µC/m²/K, a PZT-type ceramic material (lead zirconium titanium), having a pyroelectric coefficient in the order of 350 µC/m²/K, or a TGS- or LiTaO₃-type crystalline element (Triglycine sulfate), arranged between two conductive layers (electrodes) respectively connected to node SN and to node GND.

Sensor 120 further differs from sensor 110 of FIG. 1 in that it comprises no backlighting light source, but comprises a heat source, not shown. As an example, the heat source may comprise a network of resistors regularly distributed across the sensor surface. As an example, the heat source comprises one resistor per elementary cell, the resistor being arranged in the vicinity of the pyroelectric element of the cell. The resistors of the heat source are preferably arranged on the same side of the support substrate as cells 121, that is, on the upper surface side of the substrate.

Sensor 120 operates as follows. The user having placed one (or a plurality of) finger(s) on or above the upper surface of the sensor (on the side of cells 121), the heat source of the sensor is turned on and heats pyroelectric conversion elements PYR which accordingly generate electric charges on sense nodes SN of the corresponding cells 121. The quantity of heat received by each pyroelectric conversion element PYR when the heat source is turned on is greater when the corresponding cell is topped with a skin valley than when it is topped with a ridge. Indeed, when the cell is topped with a ridge, the skin (which is a relatively good heat conductor) absorbs a more significant part of the heat emitted by the source than when the cell is topped with a valley. Thus, when a cell is topped with a skin valley, the quantity of electric charges generated on its sense node SN is greater than when the cell is topped with a ridge.

During a phase of acquisition of an image point of a print by a cell 121, sense node SN of the cell is first reset via transistor RT. During an integration period (transistor RT off), charges generated by pyroelectric conversion element PYR accumulate on sense node SN of the cell. At the end of the integration, the potential of sense node SN is transferred onto output track CL of the cell via transistors SF and RD. To achieve this, transistor RD of the cell is turned on. The potential of output track CL is then read by the output stage 113 associated with output track CL. As an example, the potential of the sense node may also be read after the resetting and before the beginning of the integration, the output value of the pixel then being the difference between the reference value read before the integration and the value read after the integration.

Preferably, during an acquisition, the heat source is controlled to generate a heat pulse, and the cells are read from some time after the beginning of the pulse, and/or little after the end of this pulse, to do away with thermalization phenomena causing, over time, the uniformization of the charge levels accumulated on the sense nodes SN of the different cells.

As in the example of FIG. 1, a plurality of elementary cells 121 may be connected to a same output track CL and share a same output stage 113 of the sensor. Cells 121 are for example arranged in an array of rows and columns, the cells of a same column being connected to a same output track CL and to a same output stage 113, and the cells of different columns being connected to different output tracks CL and to different output stages 113. As an example, cells 121 are simultaneously controllable row by row. Preferably, the heat source is then controllable to heat cells 121 row by row. This enables to perform a row-by-row scanning of the sensor by synchronizing the turning on of the heat source with the cell reading, and thus to minimize the effects of thermalization on the acquired image. In this case, the heat source may be formed of conductive tracks extending along the sensor rows, for example, metal tracks (for example, made of molybdenum or of aluminum), tracks made of a metal oxide, possibly transparent (for example, made of indium tin or indium zinc oxide), polysilicon tracks, or tracks made of a conductive polymer.

Figure 3:
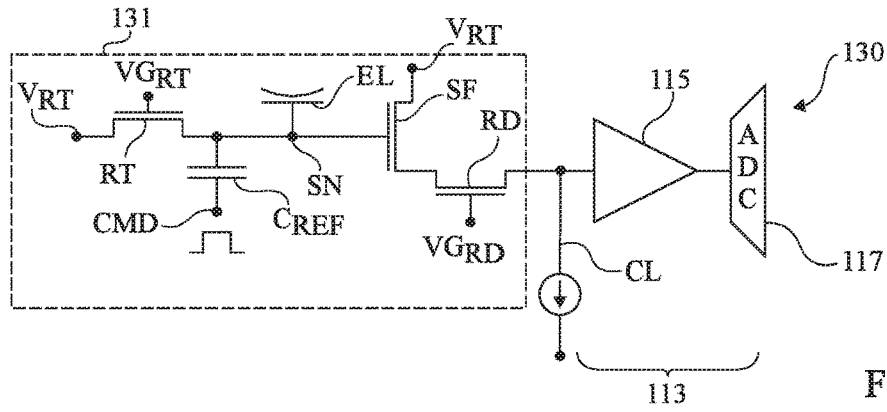
FIG. 3 is an electric diagram illustrating an example of a capacitive TFT print sensor.

FIG. 3 is an electric diagram illustrating an example of a capacitive TFT print sensor 130. Sensor 130 comprises elements common with sensors 110 and 120 of FIGS. 1 and 2. These elements will not be described again hereafter. Sensor 130 differs from sensors 110 and 120 of FIGS. 1 and 2 essentially in that, in sensor 130, capacitive-type elementary acquisition cells 131 replace the optical or thermal acquisition cells of sensors 110 and 120. In this example, sensor 130 comprises no illumination light source and no heat source. Each cell 131 comprises the same elements as a cell 111 or 121 of the sensors of FIGS. 1 and 2, except for optical conversion element PS or pyroelectric conversion element PYR. Each cell 131 further comprises a reference capacitor $C_{REF}$, connected between sense node SN of the cell and a node CMD of application of a control signal. Each cell 131 further comprises a conductive electrode EL connected to node SN, electrode EL being coated with a dielectric layer and being intended to form a capacity with the skin of a user's finger. Electrode EL is preferably placed in the vicinity of the upper surface of the sensor, so that the dielectric thickness between the upper surface of the sensor (intended to receive the user's finger) and electrode EL does not exceed a few microns, for example, 10 µm.

Sensor 130 operates as follows. The user places one (or a plurality of) finger(s) on or above the upper surface of the sensor (on the side of electrodes EL). On acquisition of an image point of the print by a cell 131, sense node SN of the cell is first reset via transistor RT of the cell. Transistor RT is then turned off, and then a control signal, for example, a square or stepped voltage, is applied to control node CMD of the cell by a control circuit, not shown. A reference value may be read from node SN after the resetting and before the application of the square voltage pulse. Reference capacitor $C_{REF}$ and the capacitor formed between electrode EL and the finger skin form a capacitive dividing bridge. A potential depending on the capacitance obtained between electrode EL and the skin is then established on sense node SN of the cell. The value of this potential is different according to whether electrode EL is topped with a ridge or with a valley of the user's skin (since the capacitance obtained between electrode EL and the skin is different according to whether electrode EL is topped with a ridge or with a valley of the skin). The potential of node SN is transferred onto output track CL of the cell via transistors SF and RD, after which the potential of output track CL is read out by the output stage 113 associated with output track CL. The step applied to node CMD can then be taken back to its initial value.

According to an aspect of the described embodiments, a print sensor formed in TFT technology is provided, the sensor comprising, on a transparent insulating support substrate, for example, made of glass, a plurality of elementary acquisition cells, each cell comprising a photoelectric or pyroelectric conversion element, enabling to acquire an optical or thermal image of a print, and an element for reading out a capacitive image of the print.

An advantage of such a sensor is that the two images are acquired by means of acquisition elements based on phenomena (optical and capacitive, or thermal and capacitive) which have, offhand, no physical relation. This enables to solve, to a certain extent, the difficulties encountered in the acquisition of so-called "difficult" fingerprints, that is, certain types of fingers for which usual sensors do not succeed in satisfactorily discriminating skin ridges from skin valleys. The inventors have indeed observed that a print which is difficult to acquire in the optical or thermal field is sometimes easier to acquire in the capacitive field and, conversely, that a print which is difficult to acquire in the capacitive field is easier to acquire in the optical or thermal field.

The fact of integrating the photoelectric or pyroelectric conversion element and the capacitive element in a same elementary cell enables to share control TFTs and thus to limit the bulk, the complexity, and the cost of the sensor.

More particularly, each cell comprises, as in the example of FIG. 3, an electrode coated with a dielectric layer, intended to form a capacitor with a user's skin, this electrode being connected to the sense node of the cell.

According to an aspect of the described embodiments, the cells however comprise no specific reference capacitor as in the example of FIG. 3. In the described embodiments, the reference capacitor used for the capacitive reading is that of the photoelectric or pyroelectric conversion element connected to the sense node of the cell. This enables to form particularly compact cells.

Figure 4:
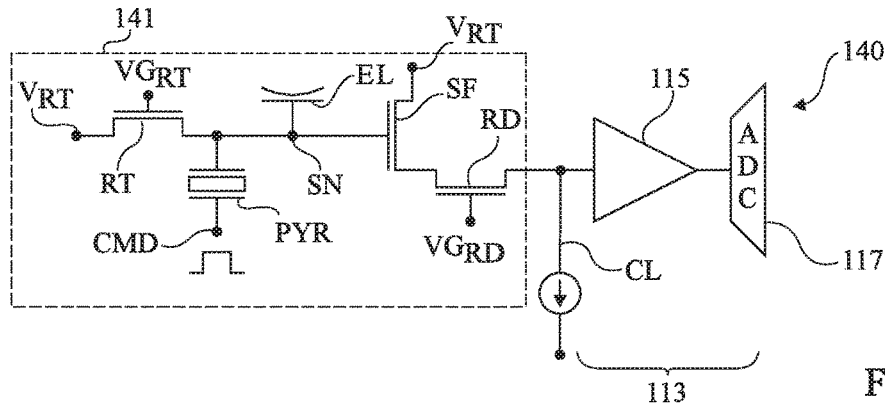
FIG. 4 is an electric diagram illustrating an embodiment of a thermal and capacitive TFT print sensor.
Figure 5:
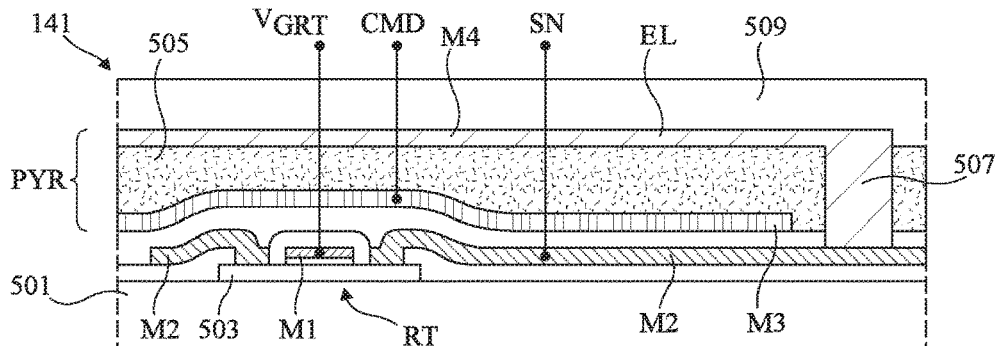
FIG. 5 is a cross-section view illustrating an embodiment of the sensor of FIG. 4.

FIG. 4 is an electric diagram illustrating an embodiment of a thermal and capacitive TFT print sensor 140. Sensor 140 of FIG. 4 comprises elements common with sensor 120 of FIG. 2. These elements will not be described again. Sensor 140 of FIG. 4 differs from sensor 120 of FIG. 2 essentially in that, in sensor 140, elementary acquisition cells 141, both thermal and capacitive, replace thermal cells 121 of sensor 120. Cells 141 of sensor 140 comprise the same elements as cells 121 of sensor 120, and differ from cells 121 in that they further each comprise a conductive electrode EL connected to node SN, electrode EL being coated with a dielectric layer and being intended to form a capacitor with the skin of a user's finger. Cells 141 of sensor 140 further differ from cells 121 of sensor 120 in that, in cells 141, instead of being connected to a node of application of a reference potential, the electrode of pyroelectric element PYR opposite to sense node SN is connected to a node CMD of application of a control signal. Electrode EL is preferably placed in the vicinity of the upper surface of the sensor, so that the dielectric thickness between the upper surface of the sensor (intended to receive the user's finger) and electrode EL does not exceed a few microns, for example, 50 µm, and preferably 10 µm. In practice, if the electrode of element PYR connected to node SN is located in the vicinity of the sensor surface, electrode EL may be confounded with this electrode, as illustrated in FIG. 5 which will be described hereafter. Cells 141 of the sensor of FIG. 4 comprise no reference capacitor specifically dedicated to capacitive reading, the reference capacitor via which the control signal is applied during a capacitive acquisition being that of pyroelectric element PYR.

To acquire a thermal image, nodes CMD of cells 141 may be set to a same fixed reference potential, the operation of sensor 140 then being identical or similar to the operation of sensor 120 of FIG. 2.

During an acquisition of a capacitive image, the heat source of the sensor may be kept off and, in each cell 141, after resetting of sense node SN of the cell via its transistor RT, a control signal capable of implementing a capacitive reading, for example, a square or stepped voltage, is applied to the node CMD of each cell 141 by a control circuit, not shown. The capacitor of element PYR and the capacitor formed between electrode EL and the skin form a capacitive dividing bridge, and a potential depending on the capacitance obtained between electrode EL and the skin is established on the sense node of each cell. The potential of node SN is transferred onto output track CL of the cell via transistors SF and RD, after which the potential of output track CL is read out by the output stage 113 associated with output track CL. The step applied to node CMD can then be taken back to its initial value.

As an example, during the acquisition of a print, the following control sequence may be implemented:
resetting of sense node SN by setting transistor RT to the conductive state, and then to the non-conductive state (a reading of the reference level of node SN may be performed after the resetting);
application of a control signal capable of implementing a capacitive reading, for example, a square voltage pulse, to node CMD;
capacitive reading of the potential of node SN in order to supply a capacitive image of the print;
resetting of sense node SN by setting transistor RT to the on state, and then to the off state;
turning-on of the heat source (as a variation, the heat source may be turned on from as soon as the cell reset phase before the turning-off of transistor RT to do away with possible parasitic noise due to transient effects of current drawn by the heat source); and
after an integration period, reading from node SN to supply a thermal image of the print.

As a variation, the order of acquisition of the capacitive and thermal images may be inverted.

In addition to the fact that it enables to obtain two images, respectively thermal and capacitive, of a same print, the sensor of FIG. 4 has the additional advantage, when it operates in thermal mode, to allow a better discrimination between ridges and valleys of the skin than a sensor of the type described in relation with FIG. 2. Indeed, during a thermal acquisition, the capacitance of sense node SN is not the same in all the sensor cells, since it includes the capacitance formed between electrode EL and the user's skin, which varies according to whether the cell is topped with a valley or with a ridge of the skin. In the case where a cell is topped with a valley of the skin, that is, where the skin is relatively distant from electrode EL, the capacitance formed between electrode EL and the skin is lower than when the cell is topped with a ridge of the skin. Thus, the capacitance of sense node SN is lower in a cell 141 topped with a valley of the skin than in a cell topped with a ridge of the skin. In other words, the charge-to-voltage conversion factor is higher in a cell 141 topped with a valley of the skin than in a cell topped with a ridge of the skin. Now, during a thermal reading, the quantity of charges generated by the pyroelectric element is higher in a cell topped with a valley of the skin than in a cell topped with a ridge of the skin. The presence of electrode EL, forming with the user's skin a capacitance which adds to the capacitance SN thus has the effect of amplifying the potential difference desired on node SN between cells topped with a ridge and cells topped with a valley of the skin.

FIG. 5 is a cross-section view schematically and partially illustrating an embodiment (non limiting) of cell 141 of the sensor of FIG. 4. More particularly, FIG. 5 shows pyroelectric element PYR, node SN, electrode EL, and reset transistor RT of the cell. In this drawing, transistors SF and RD of the cell have not been shown.

In the example of FIG. 5, cell 141 is formed on a dielectric substrate 501, for example, made of glass. A local layer 503 made of a semiconductor material, for example, polysilicon, is arranged above the upper surface of substrate 501. Transistor RT, as well as transistors SF and RD (not shown), are formed inside and on top of semiconductor layer 503. In particular, the source and drain regions and the channel-forming regions of the cell transistors are formed in layer 503. Heating resistors, not shown, forming the heat source of the sensor, may also be formed in layer 503 (for example, one resistor per cell). The gate of transistor RT is formed in a first metallization level M1 topping layer 503 and separated from layer 503 by an insulating layer forming the gate oxide of transistor RT. The source and drain electrodes of transistor RT are formed in a second metallization level M2 topping level M1. A first electrode of pyroelectric element PYR, connected to control node CMD, is formed in a third metallization level M3 topping level M2. This electrode is coated with a layer 505 of a pyroelectric material. Layer 505 is coated with the second electrode of pyroelectric element PYR, formed in a fourth metallization level M4. In this example, the second electrode (upper electrode) of pyroelectric element PYR is confounded with electrode EL, and is connected to a source or drain electrode of transistor RT (level M2) by a via 507. The source or drain electrode of transistor RT connected to electrode EL defines sense node SN of the cell and is connected to the gate of transistor RD (not shown). An insulating layer 509 coats metallization level M4. Layer 509 forms the dielectric of the capacitor between electrode EL and the user's skin. The upper surface of layer 509 is intended to be placed in contact with the skin of which a print is desired to be acquired. As an example, layer 509 has a thickness smaller than or equal to 50 µm, and preferably smaller than or equal to 10 µm.

Figure 6:
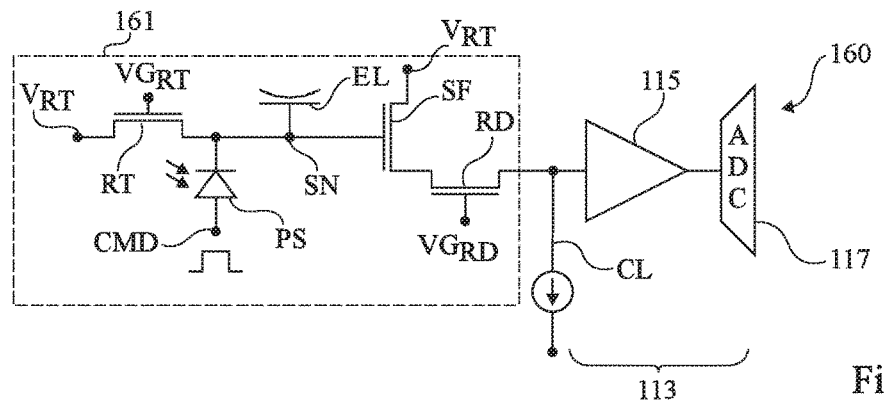
FIG. 6 is an electric diagram illustrating an embodiment of an optical and capacitive TFT print sensor.

FIG. 6 is an electric diagram illustrating an embodiment of an optical and capacitive TFT print sensor 160. Sensor 160 of FIG. 6 comprises elements common with sensor 110 of FIG. 1. These elements will not be described again. Sensor 160 of FIG. 6 differs from sensor 110 of FIG. 1 essentially in that, in sensor 160, elementary acquisition cells 161, both optical and capacitive, replace optical cells 111 of sensor 110. Cells 161 of sensor 160 comprise the same elements as cells 111 of sensor 110, and differ from cells 111 in that they further each comprise a conductive electrode EL connected to node SN, electrode EL being coated with a dielectric layer and being intended to form a capacitor with the skin of a user's finger. Further, cells 161 of sensor 160 differ from cells 111 of sensor 110 in that, in cells 161, the electrode of photoelectric element PS opposite to sense node SN (the anode of photodiode PS in the shown example) is not connected to a node of application of a reference potential, but to a node CMD of application of a control signal. Electrode EL is preferably placed in the vicinity of the upper surface of the sensor, so that the dielectric thickness between the upper surface of the sensor (intended to receive the user's finger) and electrode EL does not exceed a few microns, for example, 50 µm, and preferably 10 µm. In practice, if the electrode of element PS connected to node SN is located in the vicinity of the sensor surface, electrode EL may be confounded with this electrode. Cells 161 of the sensor of FIG. 6 comprise no reference capacitor specifically dedicated to capacitive reading, the reference capacitor via which the control signal is applied during a capacitive acquisition being that of photoelectric element PS.

To acquire an optical image, nodes CMD of cells 161 may be set to a same fixed reference potential, the operation of sensor 160 then being identical or similar to the operation of sensor 110 of FIG. 1.

During an acquisition of a capacitive image, the light source of the sensor may be kept off and, in each cell 161, after resetting of sense node SN of the cell via its transistor RT, a control signal capable of implementing a capacitive reading, for example, a square or stepped voltage, is applied to the node CMD of each cell 161 by a control circuit, not shown. The capacitor of element PS and the capacitor formed between electrode EL and the skin form a capacitive dividing bridge, and a potential depending on the capacitance obtained between electrode EL and the skin is established on the sense node of each cell. The potential of node SN is transferred onto output track CL of the cell via transistors SF and RD, after which the potential of output track CL is read out by the output stage 113 associated with output track CL. The step applied to node CMD can then be taken back to its initial value.

In addition to the fact that it enables to obtain two images, respectively optical and capacitive, of a same print, the sensor of FIG. 6 has the additional advantage, when it operates in optical mode and considering a configuration where a cell coated with a valley of the skin receives more light than a cell coated with a ridge of the skin, of allowing a better discrimination between skin ridges and valleys than a sensor of the type described in relation with FIG. 1. Indeed, during an optical acquisition, the capacitance of sense node SN is not the same in all the sensor cells, since it includes the capacitance formed between electrode EL and the user's skin, which varies according to whether the cell is topped with a valley or with a ridge of the skin. Thus, as in the example of FIG. 4, the charge-to-voltage conversion factor is higher in a cell 161 topped with a valley of the skin than in a cell topped with a ridge of the skin. Now, during an optical reading, the quantity of charges generated by the photoelectric element is higher in a cell topped with a valley of the skin than in a cell topped with a ridge of the skin. The presence of electrode EL, forming with the user's skin a capacitance which adds to the capacitance of node SN, thus has the effect of amplifying the potential difference desired on node SN between cells topped with a ridge and cells topped with a valley of the skin.

Figure 7:
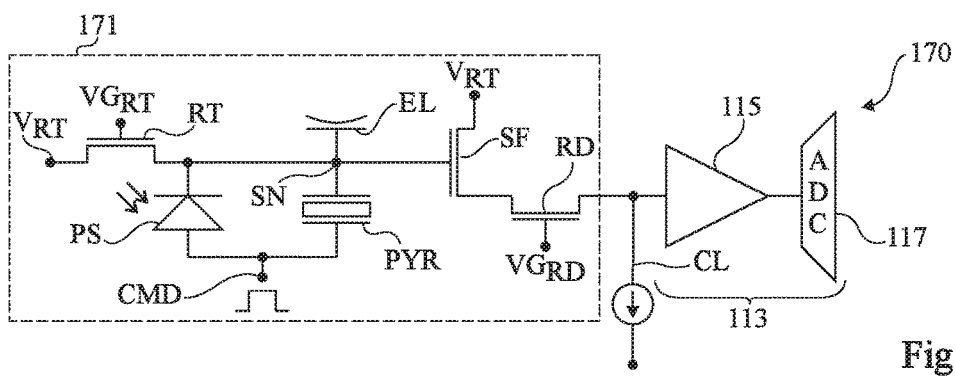
FIG. 7 is an electric diagram illustrating an embodiment of an optical, thermal, and capacitive TFT print sensor.
Figure 8:
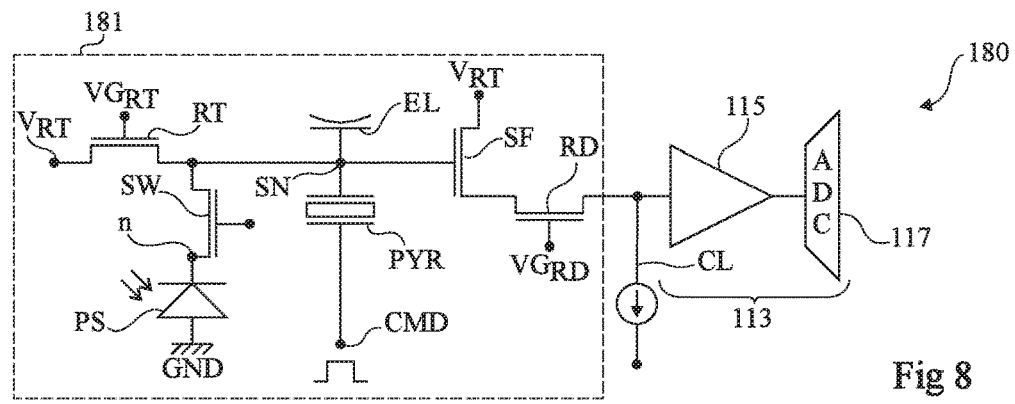
FIG. 8 is an electric diagram illustrating an alternative embodiment of the sensor of FIG. 7.

FIGS. 7 and 8 illustrate an embodiment of an optical, thermal, and capacitive TFT print sensor. An advantage of such sensors is that they enable to combine three images obtained by means of acquisition elements based on three different phenomena, further improving the detection performance.

FIG. 7 is an electric diagram of embodiment of an optical, thermal, and capacitive TFT print sensor 170. Sensor 170 of FIG. 7 comprises elements common with sensor 140 of FIG. 4. These elements will not be described again. Sensor 170 of FIG. 7 differs from sensor 140 of FIG. 4 essentially in that, in sensor 170, elementary acquisition cells 171, which are at the same time optical, thermal, and capacitive, replace thermal and capacitive cells 141 of sensor 140. In sensor 170, each elementary acquisition cell 171 comprises the same elements as an elementary acquisition cell 141 of sensor 140, and further comprises a photoelectric conversion element PS connected in parallel with pyroelectric element PYR between nodes SN and CMD. Pyroelectric element PS is for example a photodiode having its anode connected to node CMD and having its cathode connected to node SN.

Sensor 170 further comprises, in addition to the heat source (not shown) intended for the implementation of a thermal acquisition, an illumination light source (not shown) intended for the implementation of an optical acquisition of an image. The light source and the heat source are for example controllable, via a control circuit, not shown, in order to be alternately turned on and then turned off during a print acquisition phase. Thus, during a phase of acquisition of a thermal image of the print, the light source may be turned off, and the heat source may be turned on. As a result, only pyroelectric element PYR is capable of generating electric charges representative of the pattern of the print to be acquired. During a phase of acquisition of an optical image of the print, the light source may be turned on, and the heat source may be turned off. As a result, only photodetector PS is capable of generating electric charges representative of the pattern of the print to be acquired. During a phase of acquisition of a capacitive image, the heat source and the light source may be turned off, and sensor 170 may be controlled identically or similarly to what has been described in relation with FIGS. 4 and 6, the reference capacitor for the capacitive reading then being that of the parallel association of elements PYR and PS.

FIG. 8 is an electric diagram of another embodiment of an optical, thermal, and capacitive TFT print sensor 180. Sensor 180 of FIG. 8 comprises elements common with sensor 170 of FIG. 7. These elements will not be described again. Sensor 180 of FIG. 8 differs from sensor 170 of FIG. 7 essentially in that, in sensor 180, elementary acquisition cells 181 replace cells 171 of sensor 170. Cells 181 of sensor 180 differ from cells 171 of sensor 170 in that, in cells 181, photodetector PS is not directly connected between nodes CMD and SN, but is connected between node GND of application of a reference potential (for example, the ground) and an intermediate node n, node n being coupled to node SN by a selection transistor SW. More particularly, in this example, photodetector PS is a photodiode having its anode connected to node GND and having its cathode connected to node n. Pyroelectric element PYR is connected between node SN and node CMD.

In sensor 180, transistors SW enable, in each elementary acquisition cell, to isolate photodetector PS from the rest of the cell, which provides additional control possibilities as compared with sensor 170 of FIG. 7. In particular, in the example of FIG. 8, the light source may remain permanently on, and it may be provided to make transistor SW non-conductive during phases of acquisition of the thermal and capacitive images (this enables to simplify the control of the light source). Further, the variation of FIG. 8 provides more flexibility as to the sizing of optical and thermal conversion elements PS and PYR, than in a sensor of the type described in relation with FIG. 7. In particular, in the example of FIG. 8, during a capacitive acquisition, the setting to the non-conductive state of transistor SW enables the capacitance of photodetector PS not to contribute to the capacitance of sense node SN.

As a variation, in the example of FIG. 8, photodetector PS and pyroelectric element PYR may be exchanged, that is, element PYR may be placed behind selection transistor SW between nodes n and GND, photodetector PS being then directly connected to nodes SN and CMD. The choice may be performed according to the respective values of the capacitances of elements PYR and PS.

Specific embodiments have been described. Various alterations, modifications, and improvements will readily occur to those skilled in the art.

In particular, various alterations and details of implementation of sensors integrating a photoelectric conversion element and a pyroelectric conversion element in a same elementary cell are described in French patent application N° 14/59494 filed on Oct. 3, 2014, which is incorporated herein by reference. It will be within the abilities of those skilled in the art to combine the various embodiments and variations described in this prior application with the embodiments of the present application, to form an optical, thermal, and capacitive sensor, where electrode EL, intended to form a capacitor with the skin, is connected to sense node SN of the cell, and where the reference capacitance for the capacitive reading is formed by a pyroelectric conversion element and/or by a photoelectric conversion element connected to sense node SN of the cell.

Further, the described embodiments are not limited to the specific examples of architectures of elementary cells shown in the drawings. In particular, the described embodiments may be adapted to elementary cells comprising a number of TFTs different from 3.

Further, although only examples of print sensors made in TFT technology have been described hereabove, the described embodiments are not limited to this specific case. It will be within the abilities of those skilled in the art to adapt the described embodiments to other technologies, for example, to print sensors made in CMOS technology on a semiconductor substrate, for example, on a single-crystal silicon substrate.

What is claimed is:

1. A print sensor comprising, on a support substrate, a plurality of elementary acquisition cells, each cell comprising:
    a sense node;
    a first photoelectric or pyroelectric conversion element having a first electrode connected to the sense node and a second electrode connected to a control node of the cell; and
    a third electrode connected to the sense node, the third electrode being coated with a dielectric layer and being intended to form a capacitor with a user's skin,
    wherein, in each cell, the control node is capable of receiving a control signal enabling to implement the reading out, from the sense node, of a value representative of the capacitance formed between the third electrode and the user's skin.

2. The sensor of claim 1, wherein, in each cell, the first element is a photoelectric conversion element.

3. The sensor of claim 2, wherein, in each cell, the first element is photodiode having its anode connected to the control node and having its cathode connected to the sense node.

4. The sensor of claim 2, wherein each cell further comprises a pyroelectric conversion element connected between the control ode and the sense node, in parallel with the first element.

5. The sensor of claim 1, wherein, in each cell, the first element is a pyroelectric conversion element.

6. The sensor of claim 5, wherein each cell further comprises a photoelectric conversion element coupled to the sense node via a selection transistor.

7. The sensor of claim 1, wherein said control signal is a square voltage wave.

8. The sensor of claim 1, further comprising a light source and/or a heat source.

9. The sensor of claim 1, wherein, in each cell, the sense node is coupled to a node of application of a reset potential via a reset transistor.

10. The sensor of claim 1, wherein, in each cell, the sense node is coupled to an output track of the cell via a transistor assembled as a follower source and a readout transistor.

* * * * *